United States Patent [19]

Lawrence

[11] Patent Number: 5,528,180

[45] Date of Patent: Jun. 18, 1996

[54] STEERABLE PULSE PHASE CONTROLLER

[75] Inventor: Lucas G. Lawrence, San Bernardino, Calif.

[73] Assignee: Daniel J. Bondy, Las Vegas, Nev.

[21] Appl. No.: 444,008

[22] Filed: May 18, 1995

Related U.S. Application Data

[63] Continuation of Ser. No. 113,284, Aug. 27, 1993, abandoned, which is a continuation of Ser. No. 721,993, Jun. 27, 1991, abandoned.

[51] Int. Cl.⁶ .......................... H03K 12/00; H03K 3/16; G06G 7/64
[52] U.S. Cl. .......................... 327/104; 327/184; 327/190; 327/438; 327/443
[58] Field of Search .................. 328/67, 26, 28; 307/280, 282, 643, 261, 246, 630, 631, 632; 327/101, 104, 164, 165, 168, 177, 184, 190, 438, 443

[56] References Cited

U.S. PATENT DOCUMENTS

| | | | |
|---|---|---|---|
| 3,196,329 | 7/1965 | Cook et al. | 317/234 |
| 3,333,112 | 7/1967 | Vercellotti | 307/88.5 |
| 3,555,399 | 1/1971 | Buchanan et al. | 321/43 |
| 3,629,678 | 12/1971 | Tyler | 318/558 |
| 3,723,887 | 3/1973 | Panico | 328/132 |
| 3,930,170 | 12/1975 | Burens | 307/254 |
| 3,971,969 | 7/1976 | Wines | 317/148.5 |
| 4,028,559 | 6/1977 | Larner | 307/246 |
| 4,126,795 | 11/1978 | Moorey | 307/293 |
| 4,223,468 | 9/1980 | Lawrence | 43/132 |
| 4,366,644 | 1/1983 | Lawrence | 43/132 R |
| 4,755,740 | 7/1988 | Loucks | 323/224 |
| 4,782,623 | 11/1988 | Lawrence | 43/132.1 |
| 5,313,109 | 5/1994 | Smith | 307/282 |

*Primary Examiner*—David C. Nelms
*Assistant Examiner*—Trong Phan
*Attorney, Agent, or Firm*—Christie, Parker & Hale

[57] ABSTRACT

An impedance-steerable circuit for an industrial phase controller inserts precise steerable trigger pulses in the sine and cosine excursions of a sine wave of high-energy capacitive and related discharge systems. Multiple pulses and Barkhausen effects are eliminated. The controller can lock capacitive discharge systems into precise phase or, in extended embodiments, serve as a power controller for radar systems, laser systems, and beam weapons. Thyristors and thyratrons provide steered elements (pulses) activated in a pulse-feedback mode.

14 Claims, 3 Drawing Sheets

STEERABLE PULSE PHASE CONTROLLER

CROSS-REFERENCE TO RELATED APPLICATION

This is a continuation of application Ser. No. 08/113,284, filed Aug. 27, 1991, now abandoned; and which are incorporated herein by reference.

BACKGROUND OF THE INVENTION

1. Field of the Invention

The present invention relates generally to industrial phase controllers used in conjunction with thyristor trigger circuits and, in particular, to pulse sensors employing diac control.

2. Description of the Prior Art

There has been limited development of the technology pertaining to insertion of concise pulses into high power sine wave outputs. Contemporary technology is limited to half-wave devices used for control of universal alternating current (AC/DC) motors, heaters, dimmers and similar devices. The basic circuits utilized in these devices are divided into two classes: non-regulating and regulating. Regulating circuits include load sensing capabilities and compensate the system according to operating conditions. One compensation method uses pulse controlled phasing. A given motor, for example, may thus be pulse phase-controlled to prevent changes in motor speed under load conditions.

High energy capacitive discharge systems provide a vastly different and more demanding situation than the above motor example. These high energy systems are overly sensitive to phasing conditions or marginal phase timing and thus require discharge trigger points that are precise and immutable irrespective of line voltage variations. These demands are especially pronounced in time-dependent equipment (such as radar apparatus) and in systems requiring precise trigger pulse control. The apparatus for termite control described in U.S. Pat. No. 4,223,468 requires such a trigger pulse control and benefits from the present invention.

SUMMARY OF THE INVENTION

This invention provides means for generating precise, single pulses, devoid of ringing phenomena, for triggering of a power thyristor or gaseous thyratron for phase control of high-energy capacitive and related discharge systems. To safeguard against the possibility of sending more than one individual pulse to the thyristor or thyratron, the pulse source is designed to be devoid of Barkhausen effects, preventing generation of multiple pulse trains or oscillations within each pulse train. In general, the invention utilizes the trigonometry of AC phasing elements and impedance variations of circuit elements under dynamic conditions.

DETAILED DESCRIPTION OF THE INVENTION

Figure 1:
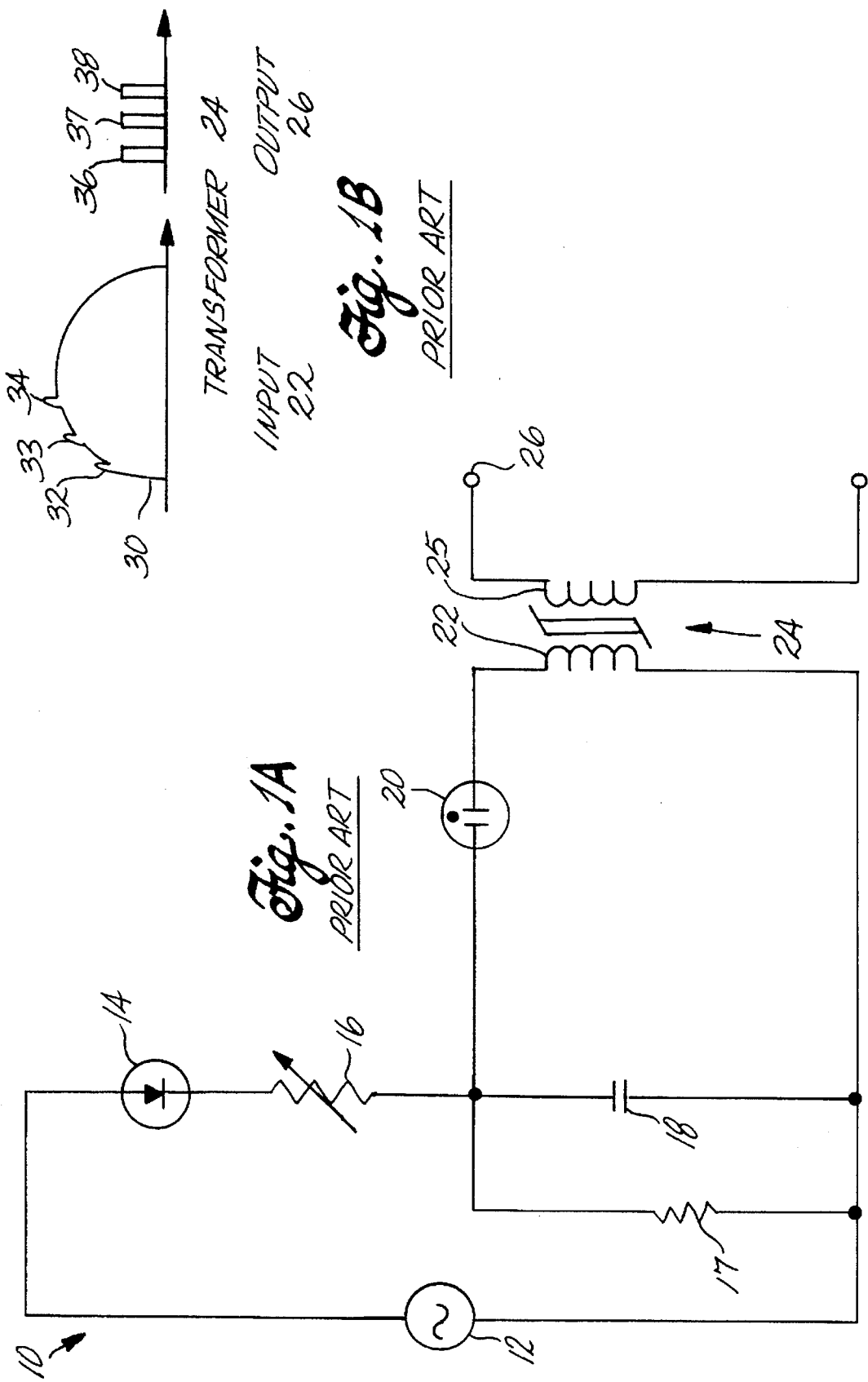
FIG. 1A is a schematic diagram of a conventional pulse generation circuit.
FIG. 1B is a graph of the input and output of the output transformer of the conventional pulse generation circuit of FIG. 1A.

FIG. 1A depicts a conventional pulse generation circuit 10 comprising an RC system including a full sine wave (AC) voltage source 12, a variable resistance 16 and a timing capacitor 18. For half-wave operation, a negative clipping diode 14 is added between AC source 12 and variable resistance 16. Because the circuit is intended to provide an output pulse of a specific voltage amplitude, a sensing element 20 (such as a neon lamp or a similar device (e.g., a diac)) is connected in series with the primary winding 22 of a pulse transformer 24.

FIG. 1B depicts the input signal on primary winding 22 and the resultant signal found on secondary winding 25 of pulse transformer 24. Unless special provisions are made, circuit 10 produces a series of multiple positive output pulses 32, 33, 34 on primary winding 22 as the incoming sine wave 30 ascends to its peak position due to repeated charge and discharge of the timing capacitor 18. Therefore, as the voltage rises, multiple pulses 36, 37 and 38 are generated on secondary winding 25 and these pulses then appear at output 26.

Figure 2:
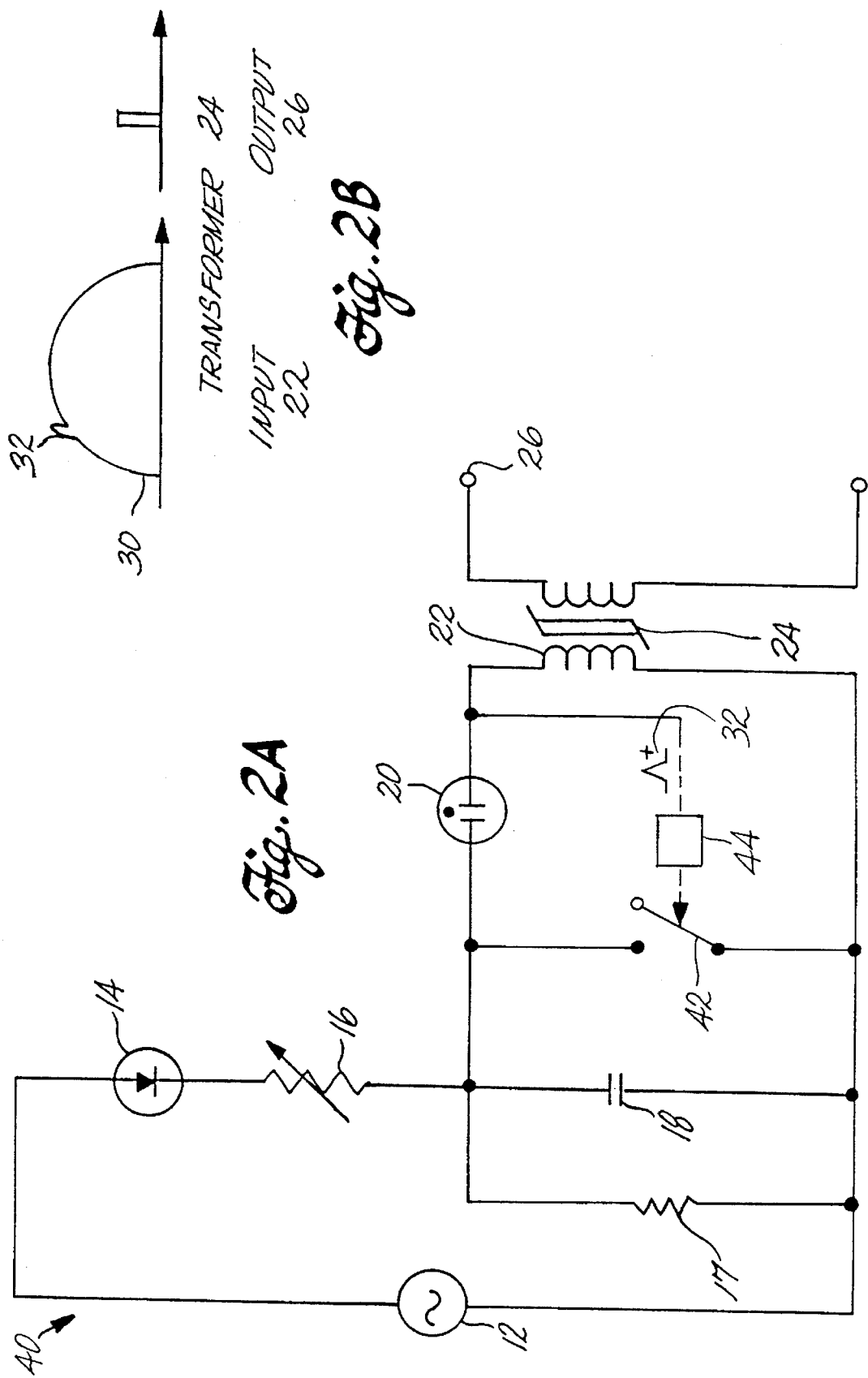
FIG. 2A is a schematic diagram of a steerable pulse generation circuit according to the present invention.
FIG. 2B is a graph of the input and output of the output transformer of the pulse generation circuit of FIG. 2A.

The circuit of FIG. 2A illustrates a solution to this problem. The pulse generation circuit 40 according to the present invention shown therein is similar to the conventional pulse generation circuit 10 of FIG. 1A, with the addition of a phasing switch 42 connected in parallel circuit relationship to the timing capacitor 18. Phasing switch 42 is triggered by sensor 44 after sensing the very first positive output pulse 32 (FIG. 2B) propagated into primary winding 22. Thus, by electrically shorting the timing capacitor 18, phasing switch 42 prevents generation of multiple pulses within each half wave cycle after the first pulse has been generated. A resistor 17 is connected across capacitor 18 for the purpose of rapidly dissipating the energy stored in the capacitor when the system is turned off to prevent an inadvertent generation of a pulse.

The mode of operation of circuit 40 is shown in FIG. 2B with only one resultant pulse 32 appearing on the secondary winding (output) 26 of the coupling transformer 24. The pulse position on the sine wave may be controlled or "steered" at will by selecting a particular value for the variable resistance 16. Steering may be executed manually or by means of transistors, vacuum tubes, photoelectric cells or other devices.

Figure 3:
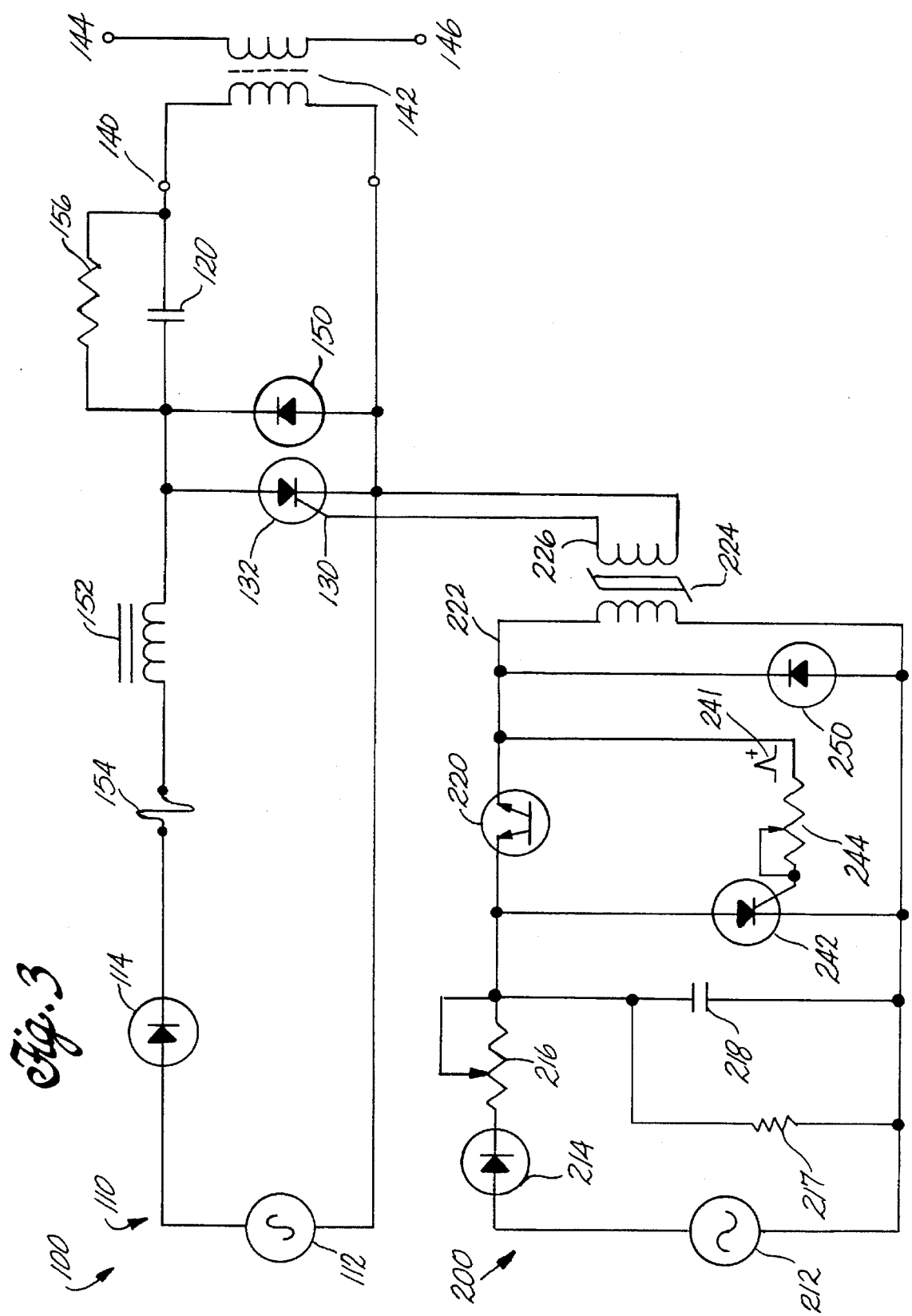
FIG. 3 is a schematic diagram of a steerable pulse generation circuit according to the present invention electrically connected to a high-energy capacitive discharge system.

FIG. 3 depicts the embodiment of a steerable pulse generation circuit according to the present invention electrically connected to a high-energy capacitive discharge system.

The main power circuit 110 is essentially that of a beam weapon. The main system capacitor 120 is charged via a rectifier 114 by the incoming sine wave generated by the AC source 112. Source 112 and source 212 are coupled, in opposite polarity, to the same AC line source as shown in FIG. 3. When the AC line source produces a negative excursion in 112, it also produces a positive excursion in 212. During the negative excursion of the AC source 112 sine wave, the voltage of AC 212 increases. When AC 212 reaches a trigger point which activates a steerable pulse phase controller 200 which, in turn, triggers the gate 130 of a triggerable semiconductor switch or a high-power thyristor 132. Because the thyristor 132 is connected in series with the discharge capacitor 120 and the primary winding 140 of a high-voltage transformer 142, a precisely timed pulse of quasi-unlimited power is conveyed into the secondary windings 144/146. An associated diode 150 provides for current continuity during the discharge cycle while a choke 152 and a fuse 154 prevent radio frequency damage to power supply 112. A resistor 156 connected across the high energy capacitor 120 rapidly dissipates stored energy when the system is turned off.

The steerable pulse phase controller 200 provides the required precise trigger pulse for trigger or gate 130 of high-power thyristor 132. The operation of steerable pulse phase controller 200 is similar to the operation of novel pulse generation circuit 40 of FIG. 2A. AC source 212 outputs a full sine wave signal into the circuit. After rectification by a negative clipping diode 214, the current passes through a variable resistance 216 for setting the precise firing point in the sine wave cycle din conjunction with the timing capacitor 218. As the sine wave voltage rises, a magnitude (typically 32 volts DC) is reached at which the series connected diac 220 turns "on". A high amperage pulse derived from the timing capacitor 218 is now conveyed into the primary winding 222 of the pulse transformer 224 and magnetically coupled into the transformer's secondary winding 226 which feeds the pulse to the gate 130 of the high power discharge thyristor 132. A resistor 217 is connected across capacitor 218 for the purpose of rapidly dissipating the energy stored in the capacitor when the system is turned off preventing any inadvertent pulse generation.

When diac 220 inaugurates the phase controlled pulse, a positive 241 pulse is fed back over a matching resistor 244 to the gate of thyristor 242, turning it "on". Thyristor 242 will now effectively shunt the timing capacitor 218 and retain this position up and until the anode voltage of thyristor 242 has cycled back to zero potential. A damper diode 250 suppresses ringing and arising Barkhausen effects. Changing the value of the variable timing resistance 216 varies the discharge system's trigger point on the negative AC excursion of the full sine wave of AC source 112 of the main power system 100. It is by means of this variable resistance that safe charging and purging phase-cycles of the main high-powered discharge capacitor 120 can be established.

Typical circuit values are: 27K ohms for the variable resistance; 0.1 microfarads for the timing capacitor; and 435 microhenries for the primary side of the pulse transformer. A typical high-energy discharge system output pulse rises at 5 microseconds and has an effective overall width of 20 microseconds. The pulse magnitude is typically 2.5 volts peak.

What is claimed is:

1. A pulse generation circuit comprising:

a source of half-wave direct current;

a pulse generating capacitor electrically coupled to the direct current source for receiving electrical energy from the source;

a phasing switch electrically coupled in parallel circuit relationship with the capacitor for shorting the capacitor;

voltage sensing means electrically coupled to the source and to the phasing switch for triggering the phasing switch in response to a first output pulse from the capacitor to prevent further pulses from being outputted in a predetermined period of said current source; and an output transformer coupled in parallel circuit relationship with the capacitor and the phasing switch for transmitting the output pulse to a point of utilization.

2. The circuit of claim 1, further comprising steering means coupled between the direct current source and the capacitor for steering the output pulse to a selected position on a half-sine-wave waveform of the direct current source.

3. The circuit of claim 2, wherein the steering means comprises a variable resistance coupled in series circuit relationship with the direct current source and the capacitor.

4. A high-energy capacitative discharge system comprising:

a first source of half-wave direct current;

a first capacitor electrically coupled to the first direct current source and to an output transformer;

a first semiconductor switch having a gate electrode, the switch being coupled in a series circuit relationship with the first capacitor and the output transformer, wherein a pulse supplied to the gate electrode results in triggering of said first semiconductor switch; and a steerable pulse phase controller circuit coupled to the gate electrode of said first semiconductor switch by a pulse transformer for generating said triggering pulse, wherein the controller circuit comprises controllable means operable for selecting the precise phase of the half-wave at which the first semiconductor switch is triggered for discharging said first capacitor through said semiconductor switch to said output transformer.

5. The system of claim 4, wherein the controller circuit comprises:

a second capacitor electrically coupled to a second source of half-wave direct current source for receiving electrical energy from the source;

shorting means comprising a second semiconductor switch electrically coupled in parallel circuit relationship to the second capacitor, and a diac coupled between the direct current source and a trigger gate of the second semiconductor switch, whereby conduction of the diac in response to the second direct current source selectively triggers the second semiconductor switch and thereby shorts the second capacitor to prevent further pulses from being outputted in a predetermined period of said second direct current source; and wherein the pulse transformer is coupled in parallel to the second capacitor and the shorting means for transmitting the output pulse to the trigger gate of the first semiconductor switch.

6. The circuit of claim 5, wherein at least one of the semiconductor switches comprises a thyristor.

7. The circuit of claim 5, wherein the controllable means comprises a variable resistance coupled in series between the direct current source and the second capacitor.

8. The circuit of claim 5, further comprising a matching resistor coupled between the trigger gate of the second semiconductor switch and the diac.

9. A steerable pulse controller circuit, comprising:

capacitance means for storing an electric charge from a half wave current source;

a pulse generating circuit coupled to said capacitance means, comprising switching means coupled to said capacitance mean for discharging said capacitance means to generate a pulse; and circuit means coupled to said pulse generating circuit between the output of said switching means and timing means, wherein said timing means is connected in parallel with said capacitance means, and wherein said timing means prevents the charging and subsequent discharging of said capacitance means for a predetermined time duration after the generation of a pulse.

10. A steerable pulse controller circuit as recited in claim 9, wherein said switching means comprise a diac.

11. A steerable pulse controller circuit as recited in claim 9, wherein said timing means comprises a semiconductor switch.

12. A steerable pulse controller circuit as recited in claim 11, wherein said circuit means comprises a signal path form an output of said switching means to a control terminal of said semiconductor switch.

13. A steerable pulse controller circuit as recited in claim 11, wherein said semiconductor switch is a thyristor.

14. A steerable pulse controller as recited in claim 9 wherein the circuit means comprises a variable resistance means.

* * * * *

UNITED STATES PATENT AND TRADEMARK OFFICE
CERTIFICATE OF CORRECTION

PATENT NO. : 5,528,180
DATED : June 18, 1996
INVENTOR(S) : Lucas G. Lawrence

It is certified that error appears in the above-indentified patent and that said Letters Patent is hereby corrected as shown below:

Column 1, line 7, delete "Aug. 27, 1991, now abandoned" and insert therefor
-- Aug. 27, 1993, abandoned, which is a continuation of Ser. No. 721,993, Jun. 27, 1991, abandoned --.
Column 3, line 20, after "cycle" replace "din" with -- in --.

Column 4, line 66, change "mean" to -- means --.
Column 6, line 2, change "form" to -- from --.

Signed and Sealed this

Fifteenth Day of April, 1997

Attest:

BRUCE LEHMAN

*Attesting Officer*  *Commissioner of Patents and Trademarks*